United States Patent
Sun et al.

(10) Patent No.: US 7,993,766 B2
(45) Date of Patent: Aug. 9, 2011

(54) PERPENDICULAR MAGNETIC RECORDING MEDIUM AND METHOD FOR FABRICATING THE SAME

(75) Inventors: An-Cheng Sun, Taipei (TW); Po-Cheng Kuo, Taipei (TW); Jen-Hwa Hsu, Taipei (TW); Huei-Li Huang, Taipei (TW); Ching-Ray Chang, Taipei (TW)

(73) Assignee: Ching-Ray CHANG, Taipei (TW)

( * ) Notice: Subject to any disclaimer, the term of this patent is extended or adjusted under 35 U.S.C. 154(b) by 100 days.

(21) Appl. No.: 12/054,591

(22) Filed: Mar. 25, 2008

(65) Prior Publication Data

US 2009/0162702 A1    Jun. 25, 2009

(30) Foreign Application Priority Data

Dec. 3, 2007   (TW) .............................. 96145977 A

(51) Int. Cl.
*G11B 5/66* (2006.01)
(52) U.S. Cl. .................................................... 428/836.1
(58) Field of Classification Search .................... None
See application file for complete search history.

(56) References Cited

U.S. PATENT DOCUMENTS

| | | | | |
|---|---|---|---|---|
| 6,440,520 B1 * | 8/2002 | Baglin et al. | ............... | 428/847.7 |
| 6,777,112 B1 * | 8/2004 | Girt et al. | ...................... | 428/828 |
| 7,311,983 B2 * | 12/2007 | Watanabe et al. | ............. | 428/829 |
| 7,361,419 B2 | 4/2008 | Uwazumi et al. | | |
| 2006/0280973 A1 | 12/2006 | Sun et al. | | |

FOREIGN PATENT DOCUMENTS

| | | |
|---|---|---|
| JP | 2004296059 A | 10/2004 |
| TW | 200643923 A | 12/2006 |

OTHER PUBLICATIONS

Laughlin et al., "Fabrication, Microstructure, Magnetic, and Recording Properties of Percolated Perpendicular Media," Feb. 2007, IEEE Trans. Magn., vol. 43, No. 2, pp. 693-697.*
Sun et al., "Magnetic Properties of Percolated Perpendicular FePt—MgO Films," Jun. 2007, IEEE TRans. Magn., vol. 43, No. 6, pp. 2130-2132.*
Qin et a., "The Effects of Post-Annealing on the Microstructure and Magnetic Properties of Percolated Perpendicular Media," IEEE Trans. Magn., vol. 43, No. 6, Jun. 2007, pp. 2136-2138.*

* cited by examiner

*Primary Examiner* — Holly Rickman
(74) *Attorney, Agent, or Firm* — Volpe and Koenig, P.C.

(57) ABSTRACT

A magnetic recording medium is provided in the present invention. The magnetic recording medium including a substrate; a base layer disposed on the substrate; an intermediate layer disposed on the base layer; and a recording layer disposed on the intermediate layer and including a magnetic matrix and a plurality of non-magnetic particles percolated in the magnetic matrix.

8 Claims, 9 Drawing Sheets

Fig. 6(a)~6(f)

PERPENDICULAR MAGNETIC RECORDING MEDIUM AND METHOD FOR FABRICATING THE SAME

FIELD OF THE INVENTION

The present invention relates to a recording medium and method for fabricating the same, in particular, to a magnetic recording medium and method for fabricating the same.

BACKGROUND OF THE INVENTION

The magnetic recording medium is a technique that utilizes the essential magnetic hysteresis feature of the recording medium to store and reproduce data. The basic bit "1" and "0" of a digital data are represented with different magnetized direction of the recording medium, so as to store these bit information.

The conventional recording schemes for storing information could be categorized into two types in accordance with the magnetic moment direction of the recording bit for the magnetic recording medium, which types are respectively a horizontal and a vertical recoding schemes. At present, the horizontal recording scheme is the most frequently used recording scheme. In the conventional horizontal recording scheme, the magnetic moment of recoding bit is laid on a surface of a thin film in parallel; however, once one would like to enhance the recording density of a magnetic medium and then tries to shrink the size of the recording bit, the demagnetizing field would thus be correspondingly increased, which causes the magnetic moment unstable. At the time, the written-in data become vulnerably vanished because of the bad thermal stability for the recording bit, which fails in meeting the requirement for the ultra highly recording density.

As to the aspect of the vertical recording scheme, the magnetic moment of recoding bit is perpendicular to a surface of a thin film. Once the size of the recording bit is shrunk, the recording particles will form a parallelepiped pillar architecture, so that the demagnetization field thereof becomes smaller whereby the unstable magnetic toque resulted from shrinking particles could be overcome, so as to completely preserve the recorded information. In particular, a granular perpendicular magnetic recoding medium possesses better thermal stability and recording resolution. As compared with the horizontal type recording medium, the granular perpendicular magnetic recoding medium could effectively promote the recording density for the recoding medium.

In order to reduce the magnetization transition jitter noise and to maintain enough medium signal to noise ratio (SNR) for the granular perpendicular magnetic recoding medium, in general, the magnetic recording particles are further shrunk to nano-scaled size. Nevertheless, such shrinkage will cause magnetic thermal instability for the granular perpendicular magnetic recoding medium system.

In order to overcome the mentioned drawbacks of the prior art, a perpendicular magnetic recording medium and method for fabricating the same are provided.

SUMMARY OF THE INVENTION

A perpendicular magnetic recording medium and method for fabricating the same are provided in the present invention. A plurality of non-magnetic particles are first formed in the recording layer of the magnetic recording medium so as to be regarded as the pinning sites. While the distances between couples of the plurality of non-magnetic particles are smaller than the sizes of the crystal granules of the magnetic particles, the magnetic zone is prone to move along a boundary consisting of the non-magnetic particles, rather than to move along a boundary consisting of the crystal granules of which the particles consist. Therefore, the size of the magnetization transition zone could be directly shrunk whereas the size of the crystal granules is unnecessary to be shrunk. The poor thermal stability for the ultra small magnetic crystal granules could be improved according to the present invention, so that the magnetization transition jitter noises are reduced and the SNR is enhanced.

According to the first aspect of the present invention, a magnetic recording medium is provided. The magnetic recording medium including a flat substrate; a base layer disposed on the flat substrate; an intermediate layer disposed on the base layer; and a recording layer disposed on the intermediate layer and including a magnetic matrix and a plurality of non-magnetic particles percolated in the magnetic matrix.

Preferably, the flat substrate is a glass substrate.

Preferably, the base layer is one selected from a group consisting of a chromium-contented layer, a chromium based alloy and a magnesium oxide layer.

Preferably, the intermediate layer is one of a platinum-contented layer and a platinum based alloy.

Preferably, the magnetic matrix is one selected from a group consisting of an iron platinum layer, a cobalt platinum layer and an iron platinum and cobalt platinum based magnetic alloy.

Preferably, each of the plurality of the non-magnetic particles is one selected from a group consisting of a carbon, a boron oxide, a titanium oxide, a zirconium oxide, a silicon oxide, a magnesium oxide, a hafnium oxide, a manganese oxidize, an aluminum nitride, a silicon nitride and a combination thereof.

Preferably, each of the plurality of the non-magnetic particles has a size ranged from 1 nm to 12 nm.

Preferably, the plurality of the non-magnetic particles are ones of nano-scaled holes and cavities.

Preferably, the nano-scaled holes and cavities have sizes ranged from 1 nm to 30 nm.

Preferably, the plurality of the non-magnetic particles have a shape selected from a group consisting of a spherical shape, a pillar-shape, a cylindrical shape, a parallelepiped pillar and a hexagonally parallelepiped pillar.

Preferably, the plurality of the non-magnetic particles in the recording layer have a volume ratio between 0% to 50%.

Preferably, the base layer, the intermediate layer and the recording layer have the thicknesses ranged respectively from 5 nm to 200 nm, from 0.5 nm to 20 nm and from 5 nm to 50 nm.

According to the second aspect of the present invention, a magnetic recording medium is further provided. The magnetic recording medium including a flat substrate; a base layer disposed on the flat substrate; an intermediate layer disposed on the base layer; and a magnetic recoding layer, in which a plurality of holes are percolated, which is disposed on the intermediate layer.

According to the third aspect of the present invention, a magnetic recording medium fabricating method is provided. The magnetic recording medium fabricating method including (a) providing a flat substrate; (b) forming a base layer on the flat substrate; (c) forming an intermediate layer on the base layer; and (d) forming a magnetic layer on the intermediate layer to have a plurality of non-magnetic particles are formed therein; and (e) percolating the plurality of non-magnetic particles in the magnetic layer.

Preferably, the base layer, the intermediate layer, the magnetic layer and the plurality of non-magnetic particles are formed by a sputtering process.

Preferably, the base layer and the intermediate layer are formed at a first temperature ranged from 200° C. to 400° C. and the magnetic layer and the plurality of non-magnetic particles are formed at a second temperature ranged from 200° C. to 600° C.

According to the fourth aspect of the present invention, a magnetic recording medium fabricating method is provided. The magnetic recording medium fabricating method including (a) providing a flat substrate; and (b) forming a dual layer including a base layer and a magnetic layer with a plurality of percolated non-magnetic particles on the flat substrate.

Preferably, the dual layer is formed by a sputtering process.

Preferably, the dual layer is formed at a temperature ranged from 200° C. to 600° C.

The foregoing and other features and advantages of the present invention will be more clearly understood through the following descriptions with reference to the drawings:

DETAILED DESCRIPTION OF THE PREFERRED EMBODIMENT

The present invention will now be described more specifically with reference to the following embodiments. It is to be noted that the following descriptions of preferred embodiments of this invention are presented herein for the aspect of illustration and description only; it is not intended to be exhaustive or to be limited to the precise from disclosed.

Figure 1:
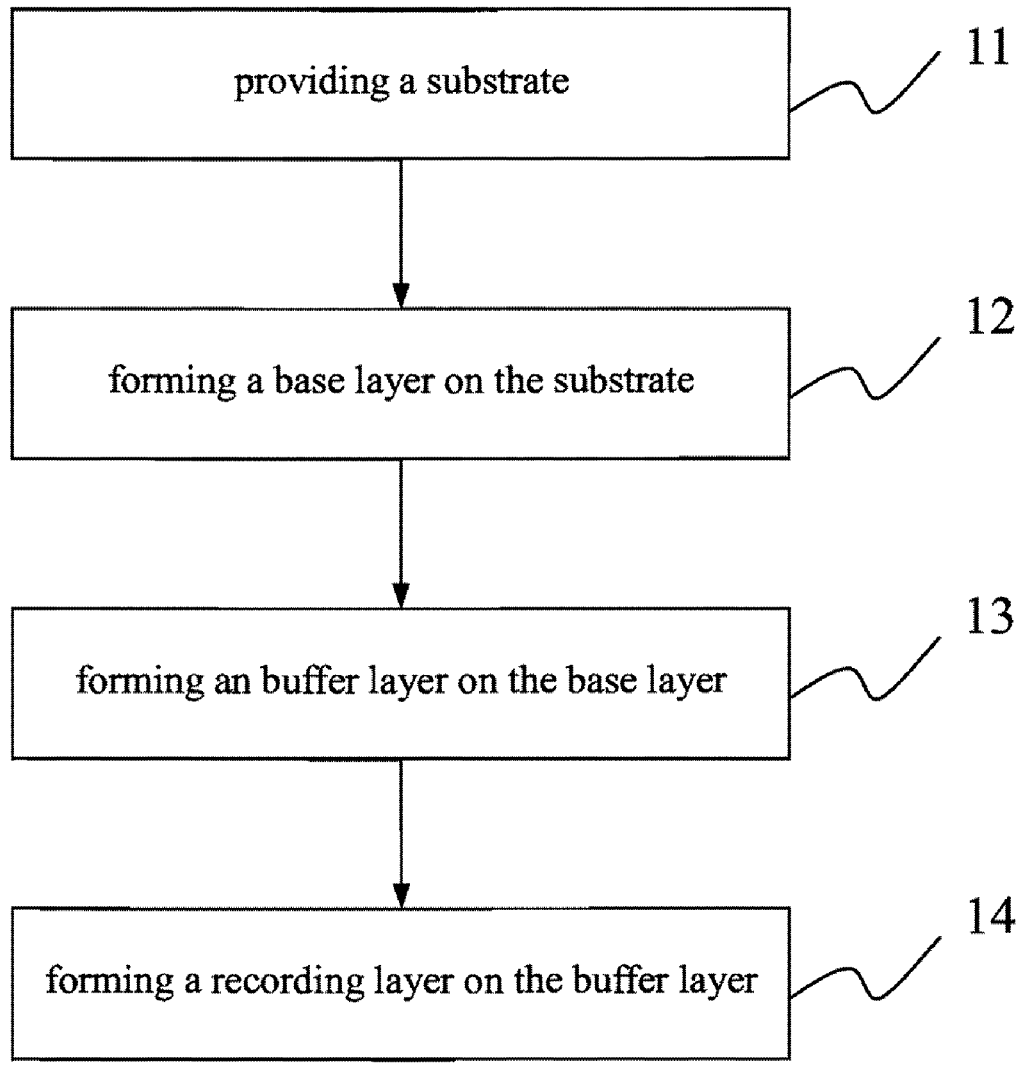
FIG. 1 is flow chart illustrating fabricating steps of a perpendicular magnetic recording medium according to the present invention.

Please refer to FIG. 1, which is flow chart illustrating fabricating steps of a perpendicular magnetic recording medium according to the present invention. The steps of the method are briefly introduced as follows: first, providing a flat substrate as shown in step 11; forming a base layer on the flat substrate as shown in step 12; forming a buffer layer (or could be termed as a intermediate layer) on the base layer as shown in step 13; finally, forming a recording layer on the buffer layer shown in step 14, wherein the recording layer consists of a magnetic matrix and a plurality of non-magnetic particles distributed in the magnetic matrix and the distances among the plurality of non-magnetic particles are smaller than the sizes of the magnetic crystal granules. The perpendicular magnetic recording medium according to the present invention is then made in accordance with the preceding descriptions.

Figure 2A:
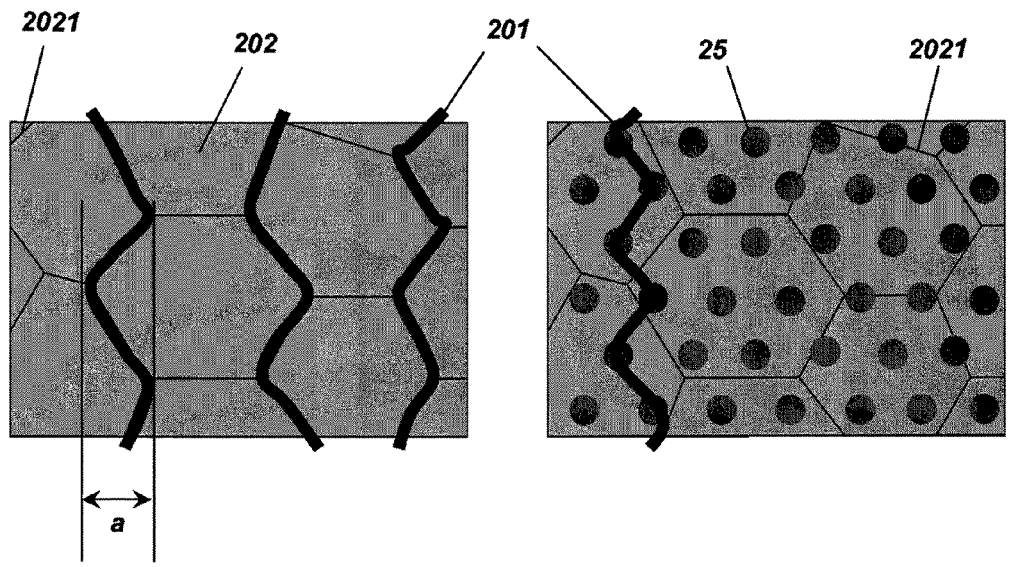
FIG. 2(a) is a diagram illustrating the microstructure before and after the non-magnetic particles are added.

In the present invention, a water-cooling highly vacuum sputtering system have to be involved in to fabricate the medium. Please refer to FIG. 2(a), which is a diagram illustrating the microstructure for the magnetic recording layer according to the present invention before and after the non-magnetic particles are added. As shown in FIG. 2(a), before the non-magnetic particles are added into the film structure 20 of the magnetic recording medium, a magnetic domain wall 201 of the film structure 20 moves along the boundary 2021 consisting of the magnetic crystal granules 202. After the non-magnetic particles (MgO) 25 are added, where the distances among the non-magnetic particles 25 are smaller than the sizes of the magnetic crystal granules 202, the magnetic domain wall 201 moves along the non-magnetic particles 25, whereby the size of the magnetization transition zone a is thus effectively reduced.

Figure 2B:
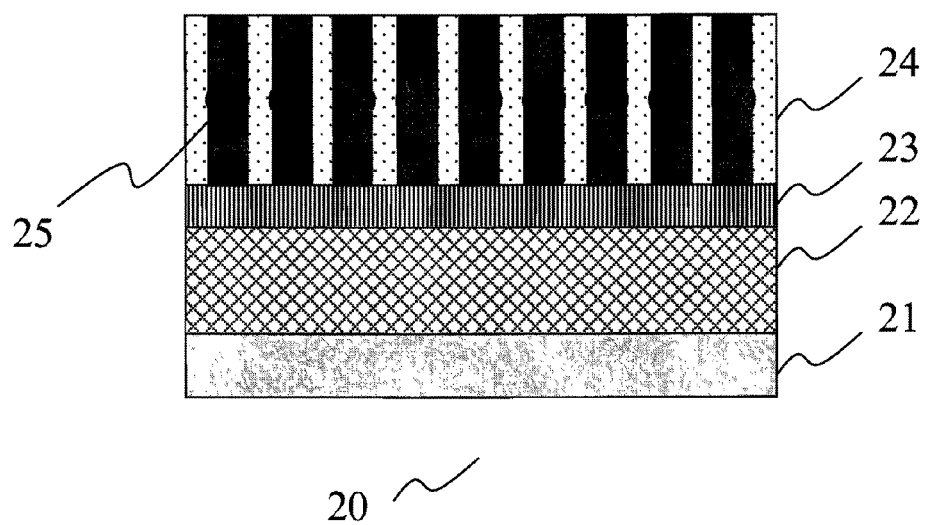
FIG. 2(b) is a diagram illustrating the cross section of the magnetic recording medium according to the present invention.

Please refer to FIG. 2(b), which is a diagram illustrating the cross-section view of the magnetic recording medium according to the present invention. As shown in FIG. 2(b), an iron platinum-contented ($Fe_{48}Pt_{52}$) magnetic recording medium 20 is first taken as an example. Initially, a CORNING 7059 barium borosilicate glass substrate 21 is a flat substrate and is pre-heated up to a temperature around 350° C., with which substrate a chromium-contented (Cr(002)) base layer 22 and a platinum-contented (Pt(001)) buffer layer 23 are respectively plated by a sputtering process. Then the substrate is heated up to a temperature ranged from 250° C. to 600° C. and a platinum-contented buffer layer 23 is plated with an iron platinum-magnesium oxide (FePt—MgO) film that is regarded as the magnetic recording layer 24 of the magnetic recording medium. In the present embodiment, a chromium-contented base layer, a platinum-contented buffer layer and an iron platinum-magnesium oxide film have the thickness ranged respectively from 5 nm to 200 nm, from 0.5 nm to 20 nm and from 5 nm to 50 nm that are preferably set to 70 nm, 2 nm and 20 nm. Furthermore, in the FePt—MgO film, the magnesium oxide regarded as the non-magnetic particles 25 has a volume ratio ranged from 0~50 vol. % that is preferably set to 0~33 vol. % and the shape and volume thereof could be adjusted by varying the radio frequency power when sputtering; nevertheless the preferable shape is the parallelepiped pillar shape.

Figure 3A:
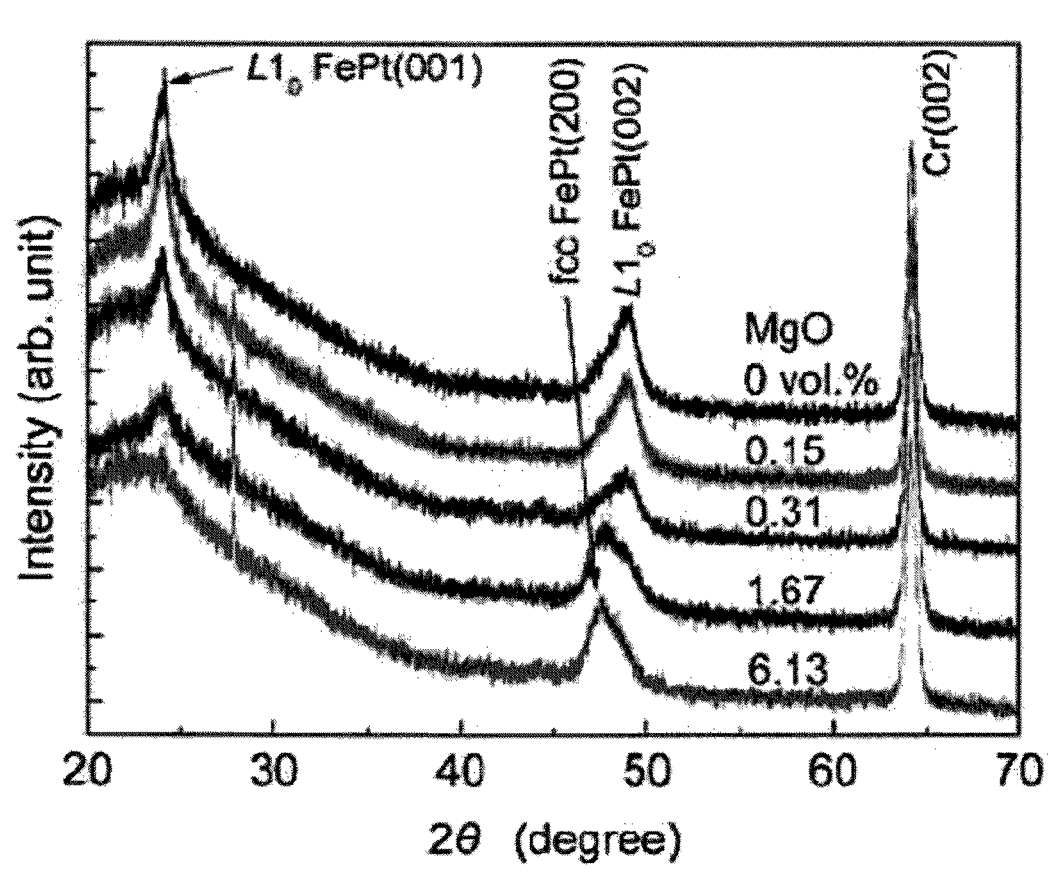
FIG. 3(a) and FIG. 3(b) are respectively the X-ray diffractive pattern illustrating for different MgO contents contained in the FePt—MgO magnetic recording layer of the magnetic recording medium and the bright field image of high resolution electronic microscope (HRTEM) thereof according to the present invention.
Figure 3B:
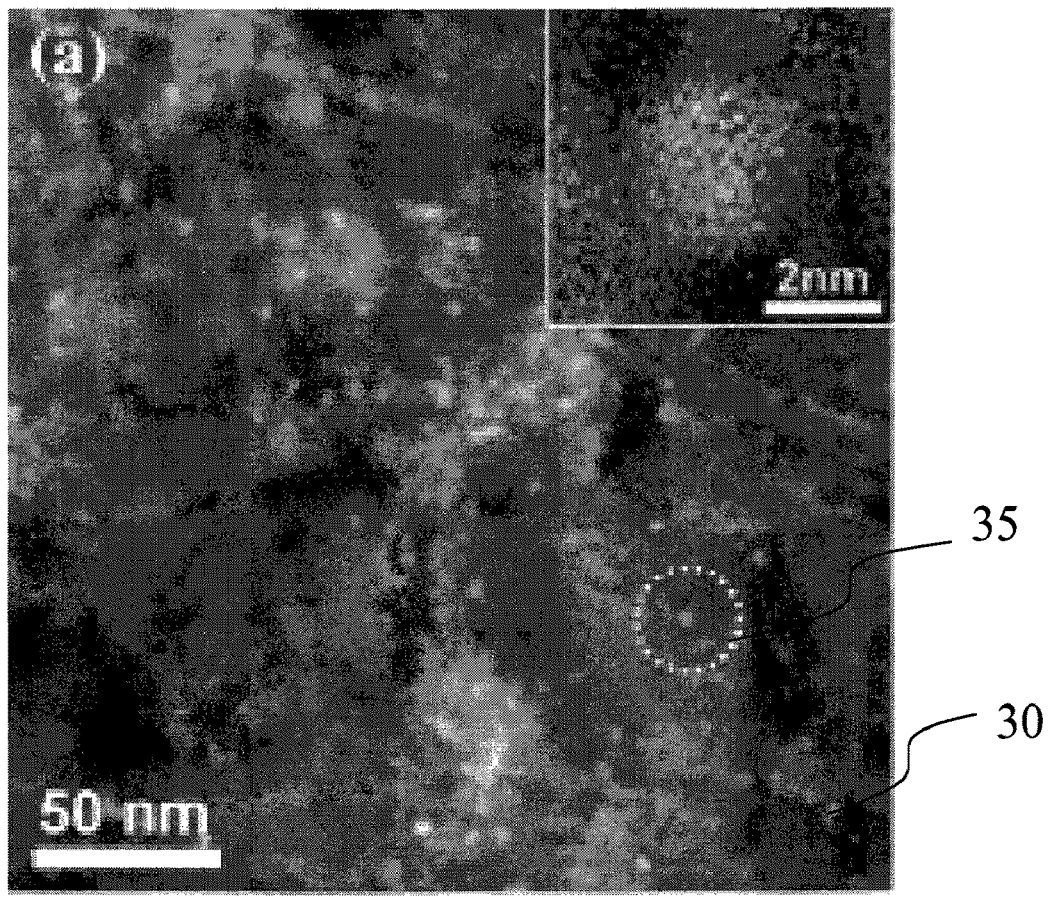

Please refer to FIG. 3(a) and FIG. 3(b), which are respectively the diagrams illustrating the X-ray diffractive pattern with respect to different MgO contents of FePt—MgO magnetic recording layer in the magnetic recording medium and the bright field image observed from a high resolution transmission electronic microscopy (HRTEM) of the magnetic recording layer according to the present invention. As shown in FIG. 3(a), exclusive of the diffractive peak of Cr(002), the other diffractive peaks shown in the diffraction pattern demonstrate that the magnetic recording layer according to the present invention has the face-centered cubic (fcc) structure or the FePt phase 30 of $L1_0$. It proves that the crystal phase structure of the magnetic recording layer according to the present invention is not changed/influenced even though the particles MgO are added in. Besides, in the magnetic recording layer, it demonstrates a very excellent ordering for the magnetic matrix FePt, which reveals that the magnetic matrix FePt (001) according to the present invention has an excellent vertical magnetic anisotropy. The above-mentioned diffractive peak is appeared until the MgO contents is gradually increased up to 6.13 vol. %. It is clearly shown in the FIG. 3(b) that the non-magnetic particle MgO has a size around 3 nm. In FIG. 3(b), it is noted that the phase 30 of the crystal granules of the magnetic matrix FePt is not thus changed/influenced due to the formation of the non-magnetic particle MgO.

Figure 4:
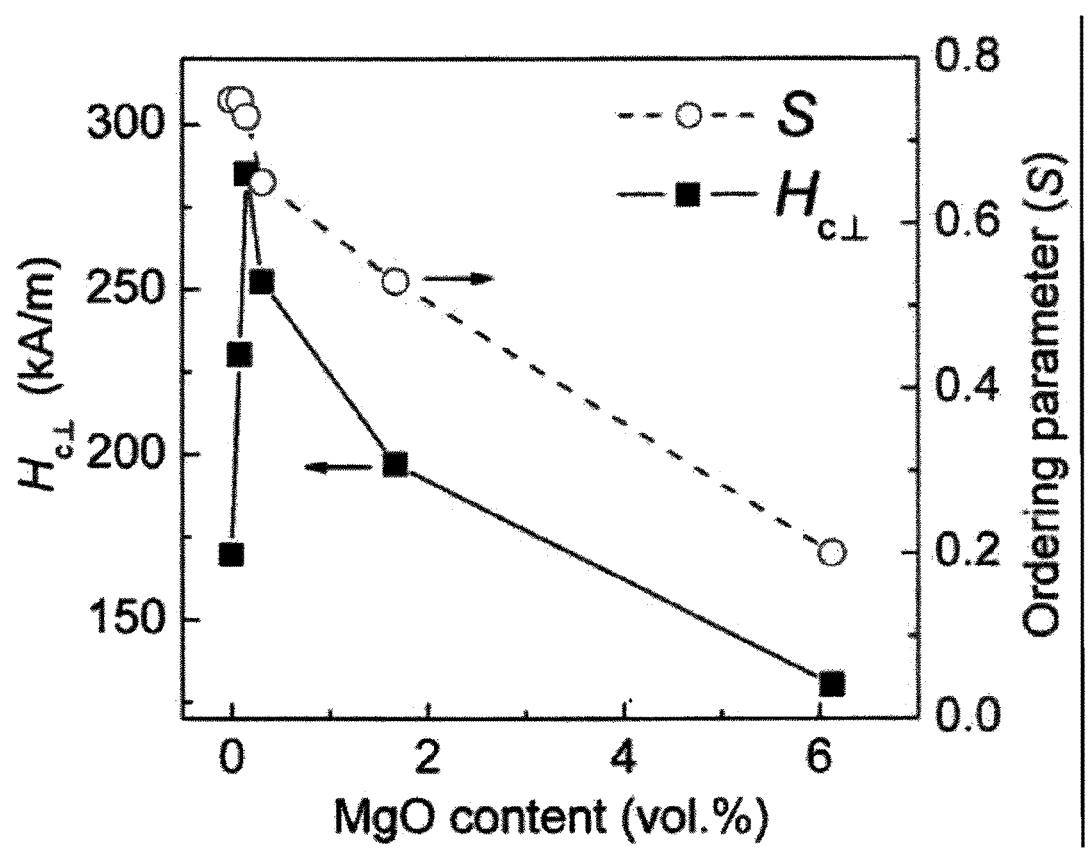
FIG. 4 is a diagram illustrating the relationship of MgO contents with respect to the ordering parameter (S) thereof and the MgO contents with respect to the vertical coercive force ($H_c\perp$) thereof in the recoding layer of the magnetic recording medium according to the present invention.

Please refer to FIG. 4, which is a diagram illustrating the relationship of MgO contents with respect to the ordering parameter (S) thereof and the MgO contents with respect to the vertical coercive force ($H_C\perp$) thereof in the recoding layer of the magnetic recording medium according to the present invention. As shown in FIG. 4, the properties S and $H_C\perp$ for the present invention could be significantly promoted with just a few amounts of MgO contents (around 0.15 vol. % merely), which is a special superiority unachievable by the state of the art.

Exclusive of the above-mentioned system, a FePt—MgO/MgO dual-layer structure could be used for replacing the above-mentioned FePt—MgO/Pt/Cr triple-layer structure. In another preferred embodiment according to the present invention, a FePt—MgO/MgO dual-layer structure is formed by sputtering process at a temperature ranged from room-temperature (about 25° C.) to 600° C. and the thickness for each layers thereof are respectively 20 nm and 10 nm. The X-ray diffractive pattern illustrating for different MgO contents (0~6.13 vol. %) contained in the FePt—MgO/MgO dual-layer structure and the bright field image of HRTEM thereof according to the present invention are respectively shown in FIG. 5 and FIG. 6(a)~(f).

Figure 5:
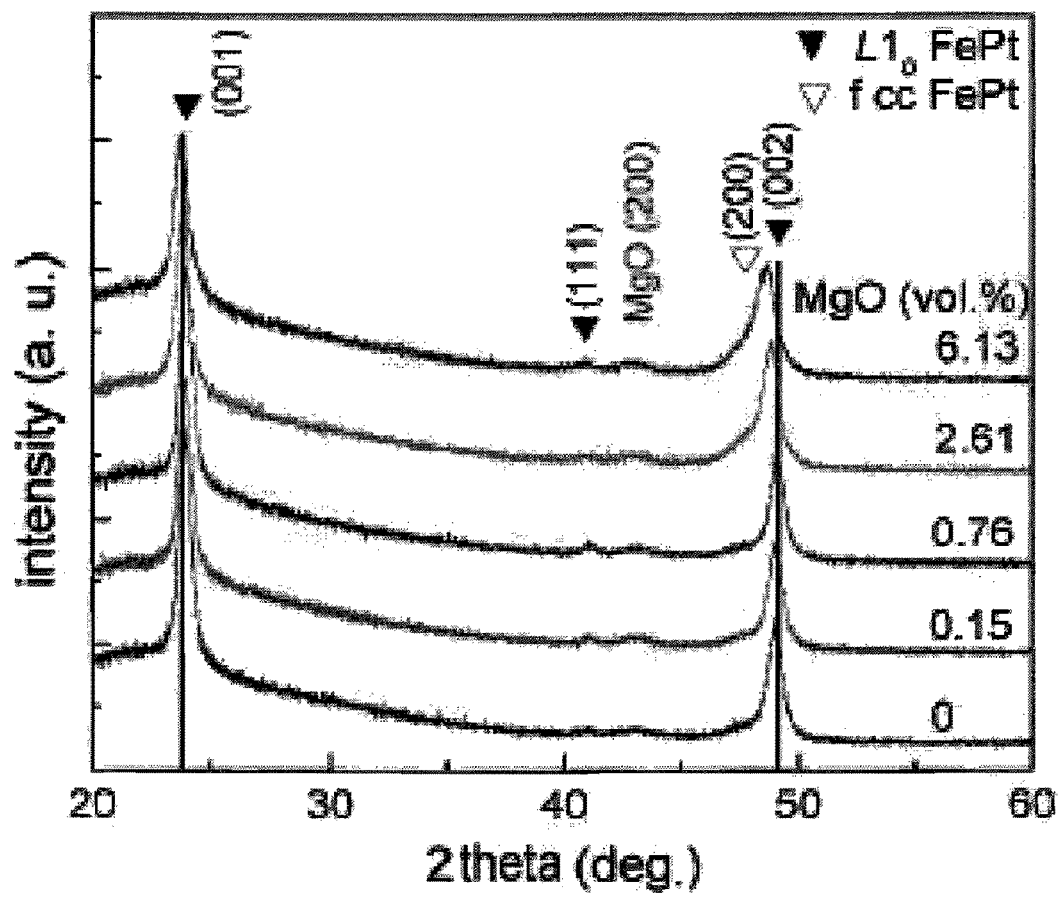
FIG. 5 and FIG. 6(a)~(f) are respectively the X-ray diffractive pattern illustrating the FePt—MgO/MgO dual-layer structure with different MgO contents (0~6.13 vol. %) and the bright field image of HRTEM thereof.

As shown in FIG. 5, exclusive of the diffractive peak of MgO at the lower layer, the other diffractive peaks shown in the pattern demonstrate that the magnetic recording layer according to the present invention has the face-centered cubic structure or the FePt phase 30 of $L1_0$. It proves that the crystal phase structure of the magnetic recording layer according to the present invention is not changed/influenced even though the particles MgO are added in. Besides, in the magnetic recording layer, it is demonstrated a very excellent ordering for the magnetic matrix FePt, which reveals that the magnetic matrix FePt according to the present invention has an excellent vertical magnetic anisotropy. The strength of the above-mentioned diffractive peak is attenuated while the MgO contents is gradually increased.

Figure 6:
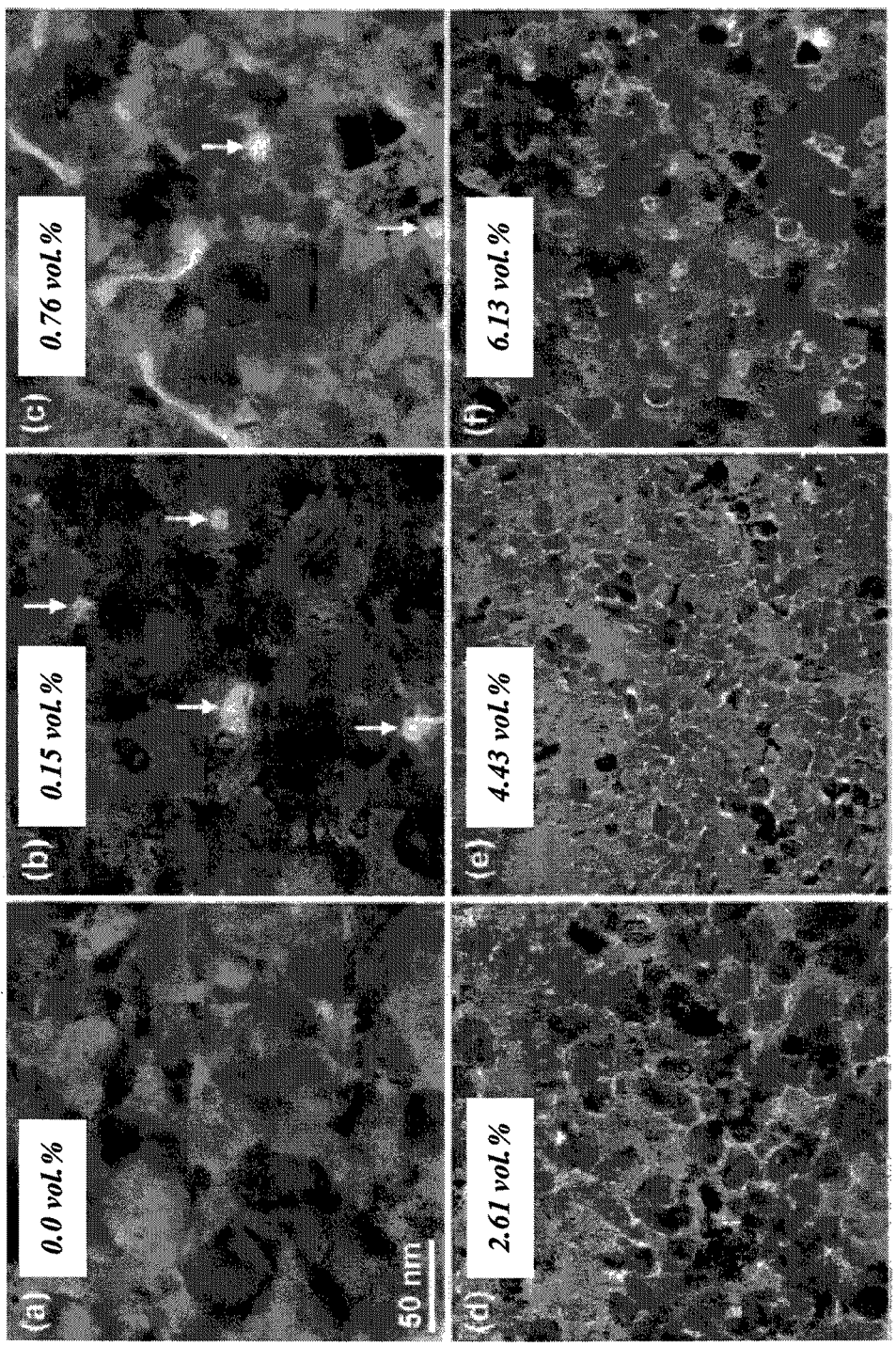

The change of the microstructure of the FePt—MgO/MgO dual-layer with respect to the contents from 0 vol. % to 6.13 vol. % of the non-magnetic particles MgO contained in the magnetic matrix FePt could be further understood via FIGS. 6(a)~(f). As shown in FIG. 6(a), while the recording layer is merely consisted of the magnetic matrix FePt without the non-magnetic particles MgO contained therein, the structure thereof is a continuous film and the crystal granules thereof have an average size around 40 nm. With the increasing of MgO contents up to 0.15 vol. %, a plurality of white particles (where the arrows are pointed in FIG. 6(b)) are gradually formed in the magnetic matrix FePt and the sizes of the crystal granules distributed in the magnetic matrix FePt are correspondingly decreased to around 35 nm. As shown in FIG. 6(c), while the contents of the particles MgO distributed in the magnetic matrix FePt is increased up to 0.76 vol. %, it is found that exclusive of the particles state, a few amounts of MgO slice are formed in the magnetic matrix; however, at the time, the most amounts of the crystal granules distributed in the magnetic matrix FePt are still contacted with each other. While the contents of the particles MgO distributed in the magnetic matrix FePt is increased up to 2.61 vol. %, as shown in FIG. 6(d), the particles MgO are getting started to be segregated at the crystal boundary of the magnetic matrix FePt and at the time a particle-slice film structure is formed, wherein the crystal granules of the magnetic matrix FePt have the size around 25 nm. The growth of the crystal granules could be suppressed by the MgO oxide formed at the crystal boundary of the magnetic matrix as shown in FIGS. 6(e) and (f). With the increasing of MgO contents up to respectively 4.43 vol. % and 6.13 vol. %, the sizes of the crystal granules of FePt correspondingly would decrease to respectively 20 nm and 15 nm, which benefits the increasing of the recording density.

Figure 7:
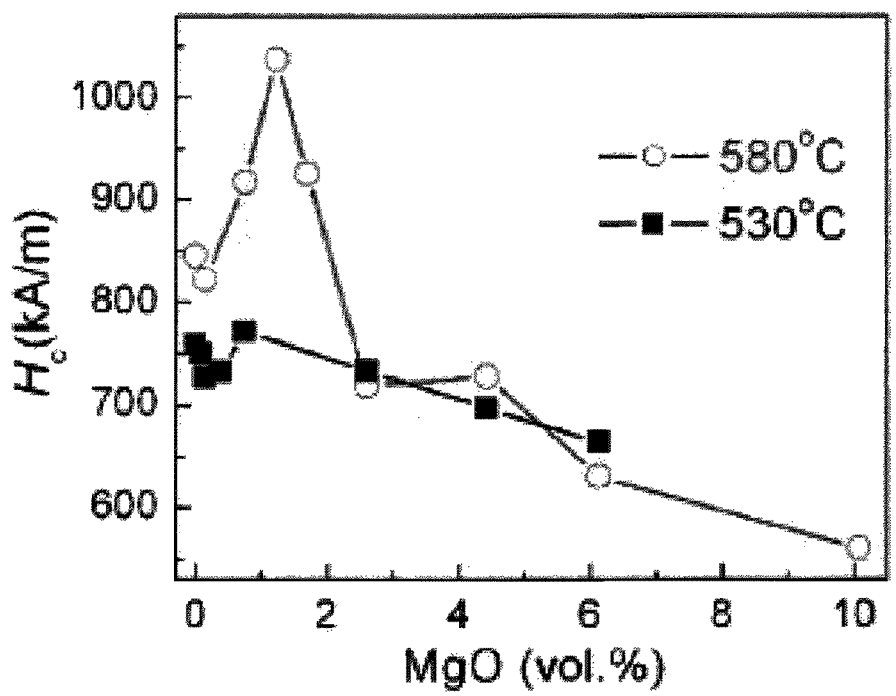
FIG. 7 is a diagram illustrating the relationship of MgO contents in the FePt—MgO/MgO dual-layer structure with respect to the vertical coercive force ($H_c\perp$) thereof in the magnetic recording medium according to the present invention.
Figure 8:
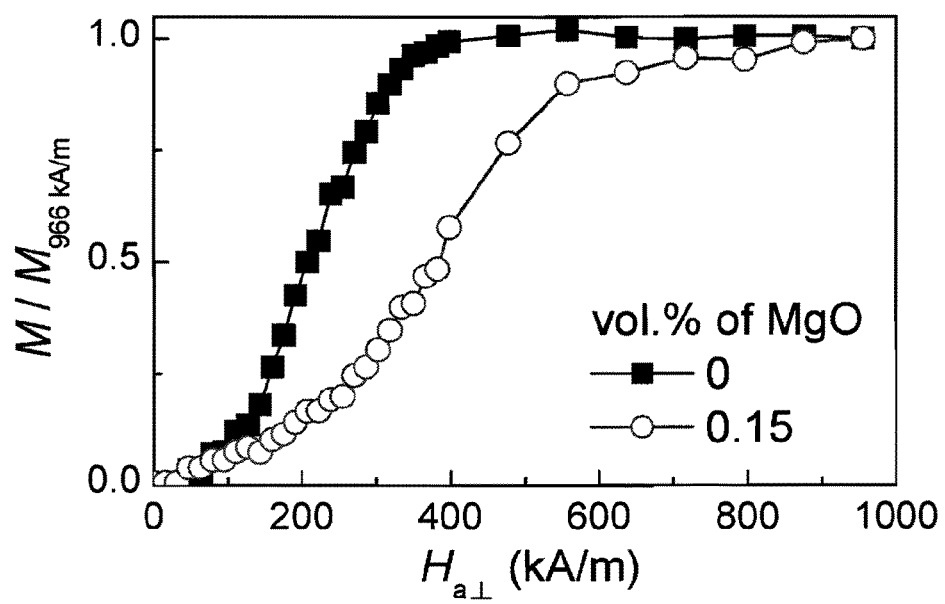
FIG. 8 is a diagram illustrating the relationship of the MgO contents distributed in the FePt—MgO/Pt/Cr triple-layer structure with respect to the initial magnetic amount thereof.

Please refer to FIG. 7, which is a diagram illustrating the relationship of MgO contents contained in the FePt—MgO/MgO dual-layer structure with respect to the vertical coercive force ($H_C\perp$) thereof in the magnetic recording medium according to the present invention. It could be concluded from the measuring results as shown in FIG. 7, the adding of the non-magnetic particles MgO into the magnetic matrix did positive for the enhancement of the magnetic parameters (for instance, the coercive force $H_C\perp$) for the present invented magnetic recording medium. Please refer to FIG. 8, which is a diagram illustrating the relationship of the MgO contents contained in the FePt—MgO/Pt/Cr triple-layer structure with respect to the initial magnetized amount thereof. It is recognized from the FIG. 8 that while the particles MgO are added into the magnetic matrix, the pinning field of the initial curve could be significantly enhanced. Therefore, regardless of the dual-layer structure or the triple-layer structure, the magnetic parameters of the magnetic recoding medium would be significantly improved with respect to the MgO contents contained in the magnetic matrix.

Figure 9:
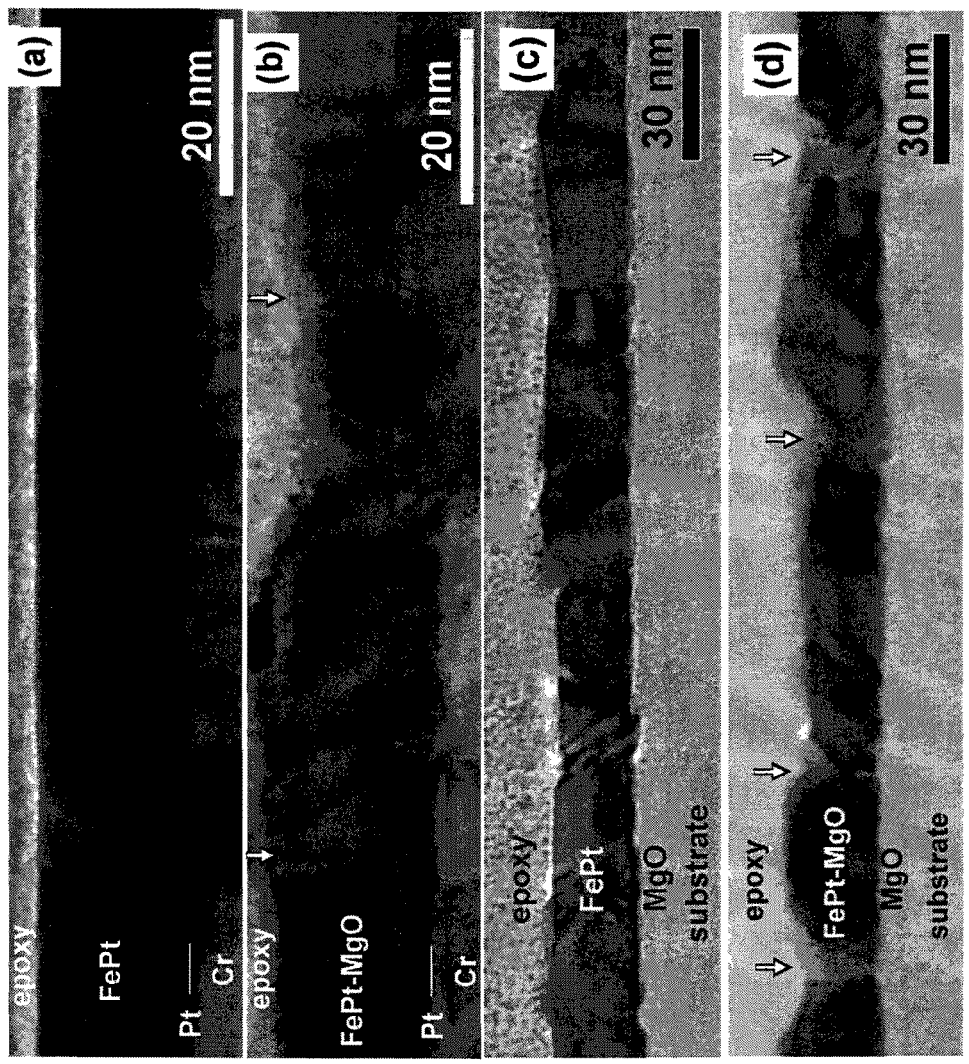
FIG. 9 is a diagram illustrating the cross-section structure formed by the non-magnetic particles contained in magnetic matrix according to the present invention.

In the present invention, the non-magnetic particles MgO are distributed in the magnetic matrix with percolated, to form a percolated perpendicular medium (PPM) structure whose non-magnetic particles are encompassed by the magnetic matrix. Please refer to FIG. 9, which is a diagram illustrating the cross-section structure formed by the non-magnetic particles contained in magnetic matrix according to the present invention. As shown in the FIG. 9, these non-magnetic particles (where the arrows are pointed) formed in the magnetic matrix have the shapes mainly in cylindrical shape are used for being regarded as the pinning sites, in order to constrain the movement of the magnetic domain wall formed in the magnetic matrix, so as to enhance the coercive force for the PPM according to the present invention. Exclusive of the cylindrical shape, these non-magnetic particles could also have a spherical shape, a pillar-shape, a parallelepiped pillar, a hexagonally parallelepiped pillar or other irregular shape. On the other hand, in accordance with the concept of the present invention, each of the plurality of the non-magnetic particles has a size ranged from 1 nm to 12 nm, preferably ranged from 3 nm to 6 nm. Alternatively, except the non-magnetic particles with the raw material MgO could be formed in the magnetic matrix FePt, the raw material of each non-magnetic particles could also be replaced by a carbon (C), a boron oxide ($B_2O_3$), a titanium oxide ($TiO_2$), a zirconium oxide ($ZrO_2$), a silicon oxide ($SiO_2$), a magnesium oxide (MgO), a hafnium oxide (HfO), a manganese oxidize (MnO), an aluminum nitride (AlN), a silicon nitride (SiN, $Si_3N_4$) non-magnetic particle or a combination thereof as long as whose size of the crystal lattice matches with the buffer layer. Furthermore, the nano-scaled voids, holes or cavities could be also be used for replacing the non-magnetic particles. For the above-mentioned alternative cases, the purpose that the non-magnetic particles are encompassed by the magnetic matrix in order to cause the pinning effect in the magnetic matrix could be equivalently achieved. While the nano-scaled voids, holes or cavities are used for replacing the non-magnetic particles, the sizes thereof are ranged from 1 mm to 30 nm, preferably ranged from 4 nm to 20 nm.

To sum up, the present invention resolves the hardly overcame issue regarding the poor thermal stability existing in a conventional magnetic recording medium that especially occurs in the medium with ultra small crystal granule and less noise output. A magnetic recording medium with ultra highly recording density is thus realized.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims that are to be accorded with the broadest interpretation, so as to encompass all such modifications and similar structures. According, the invention is not limited by the disclosure, but instead its scope is to be determined entirely by reference to the following claims.

What is claimed is:

1. A magnetic recording medium, comprising:
   a flat substrate;
   a base layer disposed on the substrate;
   a buffer layer disposed on the base layer and having a thickness from 0.5 nm to less than 20 nm; and
   a recording layer disposed on the buffer layer and including a continuous magnetic matrix and a plurality of nano-scaled non-magnetic cavities percolated in the magnetic matrix and forming a plurality of non-magnetic pinning sites, wherein the plurality of nano-scaled cavities have a spherical shape with sizes ranging from 10 nm to 30 nm.

2. The magnetic recording medium according to claim 1, wherein the substrate is a glass substrate.

3. The magnetic recording medium according to claim 1, wherein the base layer is one selected from a group consisting of a chromium-contented layer, a chromium based alloy and a magnesium oxide layer.

4. The magnetic recording medium according to claim 1, wherein the buffer layer is one of a platinum-contented layer and a platinum based alloy.

5. The magnetic recording medium according to claim 1, wherein the magnetic matrix is one selected from a group consisting of an iron platinum based magnetic alloy, a cobalt platinum based magnetic alloy and a combination thereof.

6. The magnetic recording medium according to claim 1, wherein a volume ratio of the plurality of the non-magnetic cavities over the magnetic matrix is ranged from greater than 0% to 50%.

7. The magnetic recording medium according to claim 1, wherein the base layer, the buffer layer and the recording layer have the thicknesses ranged respectively from 5 nm to 200 nm, from 0.5 nm to 20 nm and from 5 nm to 50 nm.

8. A magnetic recording medium, comprising:
   a flat substrate;
   a base layer disposed on the substrate;
   a buffer layer disposed on the base layer and having a thickness from 0.5 nm to less than 20 nm; and
   a continuous magnetic recording layer, in which a plurality of nano-scaled holes are percolated for forming a plurality of non-magnetic pinning sites, which is disposed on the buffer layer, wherein the plurality of nano-scaled holes have a spherical shape and are sized ranging from 10 nm to 30 nm.

* * * * *